United States Patent
Zhang et al.

(10) Patent No.: US 7,750,666 B2
(45) Date of Patent: Jul. 6, 2010

(54) REDUCED POWER DIFFERENTIAL TYPE TERMINATION CIRCUIT

(75) Inventors: Yu Min Zhang, Shanghai (CN); Shoujun Wang, Ottowa (CA)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/210,343

(22) Filed: Sep. 15, 2008

(65) Prior Publication Data

US 2010/0066404 A1  Mar. 18, 2010

(51) Int. Cl.
*H03K 17/16* (2006.01)
(52) U.S. Cl. .......................................... 326/30; 326/83
(58) Field of Classification Search .................. 326/26, 326/27, 30, 82–87
See application file for complete search history.

(56) References Cited

U.S. PATENT DOCUMENTS

| | | | |
|---|---|---|---|
| 5,220,211 A * | 6/1993 | Christopher et al. | 326/90 |
| 5,729,154 A * | 3/1998 | Taguchi et al. | 326/30 |
| 6,201,405 B1 * | 3/2001 | Hedberg | 326/30 |
| 6,803,790 B2 * | 10/2004 | Haycock et al. | 326/82 |
| 2006/0071683 A1 * | 4/2006 | Best et al. | 326/30 |

* cited by examiner

*Primary Examiner*—Don P Le
(74) *Attorney, Agent, or Firm*—Tracy Parris

(57) ABSTRACT

A reduced power differential type termination circuit for use in SSTL, HSTL and other transmission line systems reduces power consumption. A differential type termination circuit may comprise first and second nodes for coupling, respectively, to first and second transmission lines; a first impedance coupled between the first transmission line and a third node; a second impedance coupled between the second transmission line and the third node; and a low direct current reference voltage generator for generating a reference voltage applied to the third node. The first and second transmission lines may transmit complimentary signals. The first and second impedances may be symmetric or asymmetric. The first impedance may match the second impedance. The first and second impedances may, respectively, match the impedances of the first and second transmission lines. The first and/or second impedances may include a bidirectional switch, such as a transmission gate, to enable and disable the termination circuit.

20 Claims, 3 Drawing Sheets

REDUCED POWER DIFFERENTIAL TYPE TERMINATION CIRCUIT

TECHNICAL FIELD

The present invention generally relates to termination circuits in the field of data transmission. More particularly, the invention relates to differential type termination circuits for terminating data transmission links.

BACKGROUND

FIG. 1 illustrates a well-known impedance matching circuit used to terminate data transmission links. Impedance-matching termination circuit 100 is generally implemented on-die (i.e. as an integrated circuit on a chip rather than as discrete components on a motherboard). Termination circuit 100 is used in single-ended and differential receivers on transmission lines for technologies such as high speed transceiver logic (HSTL) and stub series terminated logic (SSTL). Termination circuit 100 comprises PMOS transistor PMA, NMOS transistor NMB, resistors RA, RB and inverter INV coupled to input pad PAD. A signal is received at input node IN through input pad PAD. Input node IN is coupled to, for example, an input terminal of a comparator in a receiver (not shown).

Coupled in series between source voltage VDD and ground GND are PMOS transistor PMA, resistor RA, resistor RB and NMOS transistor NMB. Input pad PAD is coupled to the center of this series of components at input node IN between resistors RA and RB. Transistors NMB and PMA are controlled by an enable signal ENABLE. Because of the presence of inverter INV, when enable signal ENABLE is logic high both transistors NMB and PMA are turned on. When enable signal ENABLE is logic low, both transistors NMB and PMA are turned off. When transistors NMB, PMA are enabled, DC current $I_{DC}$ flows from VDD to ground GND through PMOS transistor PMA, resistor RA, resistor RB and NMOS transistor NMB.

The on resistance of PMOS transistor PMA and resistor RA together form a pull-up resistance $R_{PULLUP}$. Likewise, the on resistance of NMOS transistor NMA and resistor RB together form a pull-down resistance $R_{PULLDOWN}$. To obtain a common mode voltage of ½ VDD at input node IN, $R_{PULLUP}$ is designed to be equivalent to $R_{PULLDOWN}$. The value of $R_{PULLUP}$ and $R_{PULLDOWN}$ depends on the impedance of the transmission line (not shown) coupled to input pad PAD. To avoid reflections, the output impedance of circuit 100, which is referred to as RTT, should match the transmission line impedance. In the Thevenin type termination shown in FIG. 1, the parallel combination of $R_{PULLUP}$ and $R_{PULLDOWN}$ must match the transmission line impedance. As such, the value of each of $R_{PULLUP}$ and $R_{PULLDOWN}$ should be twice the value of the transmission line impedance.

For example, if the transmission line impedance is 50 Ohms, then $R_{PULLUP}$ and $R_{PULLDOWN}$ will each be 100 Ohms (i.e. 2*RTT where RTT=50 Ohms) so that the output impedance of termination circuit 100 (i.e. RTT) will be 50 Ohms. In this case, DC current $I_{DC}$ would flow through 200 Ohms. Where VDD equals 1.8 Volts, as in the case of SSTL technology, then $I_{DC}$ would be 0.009 Amperes or 9 mA. A DC current of 9 mA is considerable and problematic considering chips, subject to limitations on power consumption, may have many inputs with on-die terminations. Further, wasteful power consumption should be eliminated where possible. Thus, at least to reduce power consumption, there is a need for improved termination circuitry for data transmission links.

SUMMARY

This Summary is provided to introduce concepts in a simplified form. These concepts are described in greater detail below in the section entitled Detailed Description Of Illustrative Embodiments. This Summary is not intended to identify key or essential features of the claimed subject matter, nor limit the scope thereof.

The present invention provides for a reduced power differential type termination circuit for use in stub series terminated logic (SSTL), high speed transceiver logic (HSTL) and other transmission line systems. A differential type termination circuit in accordance with some embodiments of the invention, whether implemented on or off die, stand-alone, in a receiver or in a transmission system may comprise, for example, first and second nodes for coupling, respectively, to first and second transmission lines; a first impedance coupled between the first transmission line and a third node; a second impedance coupled between the second transmission line and the third node; and a low direct current reference voltage generator for generating a reference voltage applied to the third node.

The first and second transmission lines may transmit complimentary signals. Transmitted signals may have multiple states between two voltages, whether positive or negative, or a positive or negative voltage and ground. The first impedance may match the second impedance. The first impedance may match the impedance of the first transmission line and the second impedance may match the impedance of the second transmission line. The first and second impedances may be symmetric or asymmetric. The first and/or second impedances may include a bidirectional switch, such as a transmission gate, to enable and disable the termination circuit. As may be required in some applications, the reference voltage may be one-half the peak magnitude of signals transmitted on the transmission lines.

The reduced power differential type termination circuit, at least in some implementations relative to other termination circuits, may reduce power consumption while maintaining or improving signal integrity and overall performance.

BRIEF DESCRIPTION OF THE DRAWINGS

The foregoing summary, as well as the following detailed description, is better understood when read in conjunction with the accompanying drawings. For the purpose of illustrating various aspects of reduced power differential type termination, there is shown in the drawings exemplary implementations thereof. However, reduced power differential type termination is not limited to the specific implementations disclosed herein.

DETAILED DESCRIPTION OF ILLUSTRATIVE EMBODIMENTS

Figure 1:
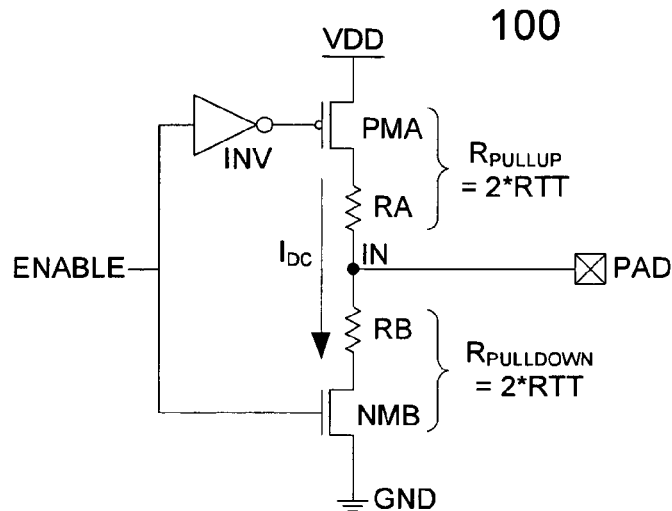
FIG. 1 illustrates a well-known impedance matching circuit used to terminate data transmission links.

Reference will now be made to embodiments of the present technology for a reduced power differential type termination circuit, examples of which are illustrated in the accompanying drawings. While the technology for a reduced power differential type termination circuit will be described in conjunction with various embodiments, it will be understood that the embodiments are not intended to limit the present technology. On the contrary, the present technology is intended to cover alternatives, modifications, and equivalents, which may be included within the spirit and scope the various embodiments as defined by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

Unless specifically stated otherwise, terms such as "sampling," "latching," "determining," "selecting," "storing," "registering," "creating," "including," "comparing," "receiving," "providing," "generating," "associating," and "arranging", or the like, refer to the actions and processes of an electronic device that manipulates and transforms data represented as physical (electronic) quantities within the electronic device.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or though an indirect electrical connection via other devices and connections. Furthermore, the term "information" is intended to refer to any data, instructions, or control sequences that may be communicated between components of a device. For example, if information is sent between two components, data, instructions, control sequences, or any combination thereof may be sent between the two components.

The present invention provides for a reduced power differential type termination circuit for use in stub series terminated logic (SSTL), high speed transceiver logic (HSTL) and other transmission line systems. A differential type termination circuit in accordance with some embodiments of the invention, whether implemented on or off die, stand-alone, in a receiver or in a transmission system may comprise, for example, first and second nodes for coupling, respectively, to first and second transmission lines; a first impedance coupled between the first transmission line and a third node; a second impedance coupled between the second transmission line and the third node; and a low direct current reference voltage generator for generating a reference voltage applied to the third node.

The first and second transmission lines may transmit complimentary signals. Transmitted signals may have multiple states between two voltages, whether positive or negative, or between a voltage and ground. The first impedance may match the second impedance. The first impedance may match the impedance of the first transmission line and the second impedance may match the impedance of the second transmission line. The first and second impedances may be symmetric or asymmetric. The first and/or second impedances may include a bidirectional switch, such as a transmission gate, to enable and disable the termination circuit. As may be required in some applications, the reference voltage may be one-half the peak magnitude of signals transmitted on the transmission lines.

Figure 2:
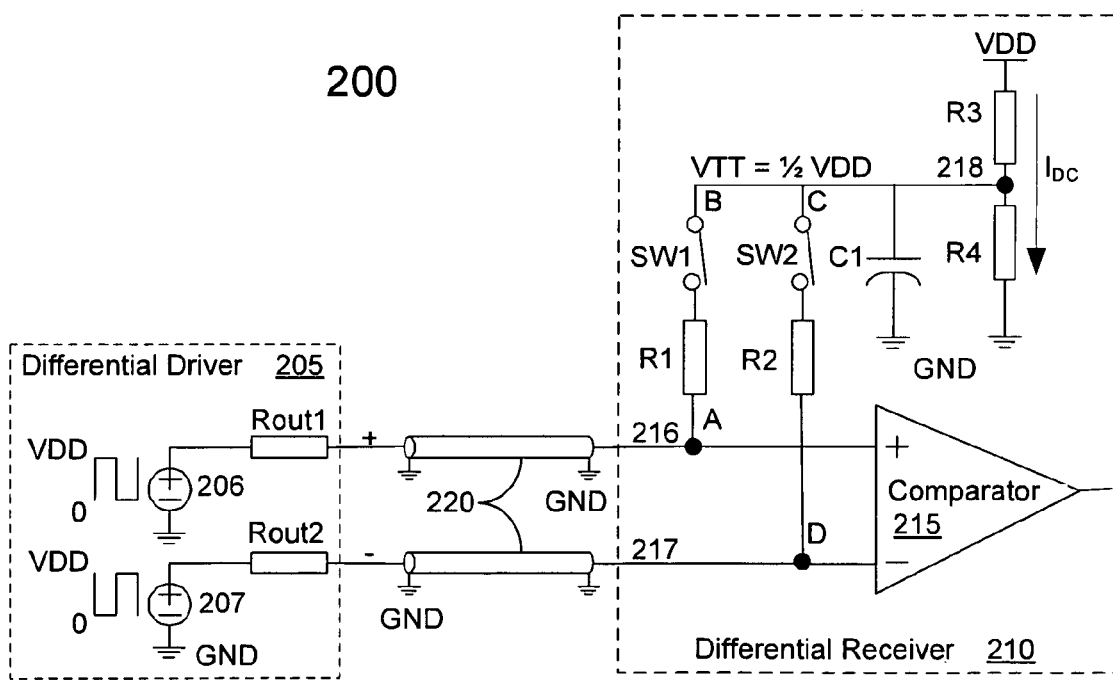
FIG. 2, in accordance with some embodiments of the invention, illustrates an exemplary implementation of a reduced power differential type termination circuit.

FIG. 2, in accordance with some embodiments of the invention, illustrates an exemplary implementation of a reduced power differential type termination circuit. As illustrated in FIG. 2, transmission line system 200 comprises differential driver 205, differential receiver 210 and transmission line 220. System 200 represents an SSTL, HSTL or any of many other transmission line systems and may be configured specifically for any transmission line system. As illustrated by "+" and "−" signs, transmission line 220 illustrates a differential transmission line for transmitting complimentary signals. In other embodiments, transmission line 220 need not transmit complimentary signals. Differential driver 205 is shown with output impedances Rout1 and Rout2. Ideally, Rout1 should approximately (i.e. within ±10%) match the impedance of positive transmission line 220+ and Rout2 should approximately match the impedance of negative transmission line 220−, although acceptable tolerances may vary from one implementation to the next. Differential driver 205 transmits complimentary signals 206, 207 onto positive and negative transmission lines 220±, respectively, through Rout1 and Rout2. While the embodiment shown in FIG. 2 shows operation of system 200 between source voltage VDD and ground GND, in other embodiments operation of system 200 may be between first and second voltage magnitudes, whether positive or negative or between ground GND and a negative voltage.

Differential receiver 210 comprises a differential type termination circuit coupled between first and second transmission lines 220±. Differential receiver 210 comprises a comparator 215 and a differential type termination circuit. The differential type termination circuit may be implemented on or off die depending on the embodiment. The differential type termination circuit shown in FIG. 2 comprises first and second resistors R1, R2, first and second switches SW1, SW2, decoupling capacitor C1, and third and fourth resistors R3, R4. The resistors may be, for example, polysilicon resistors. Differential receiver 210 comprises first and second nodes 216, 217 coupled, respectively, to first and second transmission lines 220±. Comparator 215 is coupled to first and second transmission lines 220± at nodes 216, 217 for purposes of comparing complimentary signals transmitted thereon by differential driver 205. As shown, comparator 215 generates a single-ended output signal. In other embodiments, the comparator may output single-ended or differential signals.

With respect to the differential type termination circuit, a first impedance, having terminals A and B, is formed by series coupled first resistor R1 and first switch SW1. Terminal A of this first impedance is coupled to first node 216 while terminal B of the first impedance is coupled to a third node 218. Likewise, a second impedance, having terminals C and D, is formed by series coupled second resistor R2 and second switch SW2. Terminal C of this first impedance is coupled to third node 218 while terminal D of the first impedance is coupled to a second node 217. While first and second impedances are shown as a series combination of impedances provided by a resistor and a switch, other embodiments may implement other impedances and configurations according to the requirements of particular implementations. Such impedances may include resistive, inductive and/or capacitive components.

While it may be relatively small in comparison to the impedance of first and second resistors R1 and R2, first and second switches SW1 and SW2 may have impedance components such as an on resistance. The combined impedance of first switch SW1 and first resistor R1 is referred to as the first impedance. First impedance may match the impedance of positive transmission line 220+. Likewise, the combined impedance of second switch SW2 and second resistor R2 is referred to as the second impedance. Second impedance may match the impedance of negative transmission line 220−. While first and second impedances in FIG. 2 are symmetric in this embodiment, they may be asymmetric in other embodiments. First and second impedances may match or they may not match one another depending on the requirements of particular implementations.

First and second switches SW1 and SW2 may be used to enable and disable the termination circuit. When switches SW1 and SW2 are open, the termination circuit is disabled. When switches SW1 and SW2 are closed, the termination circuit is enabled. Other embodiments may implement alternative arrangements to enable and disable the termination circuit, including fewer or additional switches. Some embodiments may not have a means to enable and disable the termination circuit. For the embodiment shown in FIG. 2, switches SW1 and SW2 are bidirectional switches that pass current in either direction.

A reference voltage generator is formed by third and fourth resistors R3 and R4 coupled in series between source voltage VDD and ground GND. Third resistor R3 is coupled between source voltage VDD and third node 218 while fourth resistor R4 is coupled between third node 218 and ground GND. Reference voltage VTT is provided at third node 218 between the third and fourth resistors R3, R4. Third node 218 is referred to as a common mode node. In other embodiments, the reference voltage generator may comprise different components in different configurations. In order to keep direct current low (i.e. less than 0.001 Amperes) in this particular embodiment of a reference voltage generator, resistors R1 and R2 may be relatively large. For example, where source voltage VDD is 1.8 Volts, if third and fourth resistors are each 10,000 Ohms (Ω), then direct current $I_{DC}$ shown in FIG. 2 would be 0.000090 Amperes or 90 μA. This is a relatively small DC current to produce reference voltage VTT at third node 218. Where resistors R1 and R2 are equal, as in this embodiment, the third node between third and fourth resistors R3, R4 will be one-half source voltage VDD. Depending on the embodiment, the magnitude of VTT may be approximate, i.e., ±10% of its target value. Reference voltage VTT is not limited to one-half source voltage VDD in other embodiments. It may vary with requirements of other implementations. In order to make common mode (i.e. third) node 218 have low AC impedance, decoupling capacitor C1 may be coupled between third node 218 and ground. Decoupling capacitor C1 reduces switching noise on reference voltage VTT. The value of decoupling capacitor C1 may be, for example, 20 pF, but an appropriate value may vary from one embodiment to the next.

The operation of transmission system 200 will now be discussed. When first and second switches SW1 and SW2 are open or when differential driver 205 is in a high impedance state (i.e. high-Z), then third node 218 is floating, though kept at one-half source voltage VDD by the reference voltage generator, which itself may be enabled and disabled, e.g., by a switch (not shown). When differential driver 205 is enabled and first and second switches SW1, SW2 are closed then a voltage divider circuit is formed between differential driver 205 and differential receiver 210. Differential driver 205 generates complimentary signals on positive and negative transmission lines 220±. When positive transmission line 220+ is driven high while negative transmission line 220− is driven low by differential driver 205, current flows through Rout1, positive transmission line 220+, first resistor R1, first switch SW1, second switch SW2, second resistor R2, negative transmission line 220− and Rout2 to ground GND. Current follows the reverse path when positive transmission line 220+ is driven low while negative transmission line 220− is driven high by differential driver 205. Regardless of the direction current flows, the voltage divider involving the cumulative impedances from and including Rout1 to third node 218 and from third node 218 to and including Rout2, determine the voltages received by comparator 215 at first and second nodes 216, 217. While it may vary from one embodiment to the next, in this particular embodiment the value of output impedances Rout1, Rout2 should be equal while the value of first and second resistors R1, R2 should be equal so that the voltages received by comparator 215 will be complimentary at source voltage VDD and ground GND.

Figure 3:
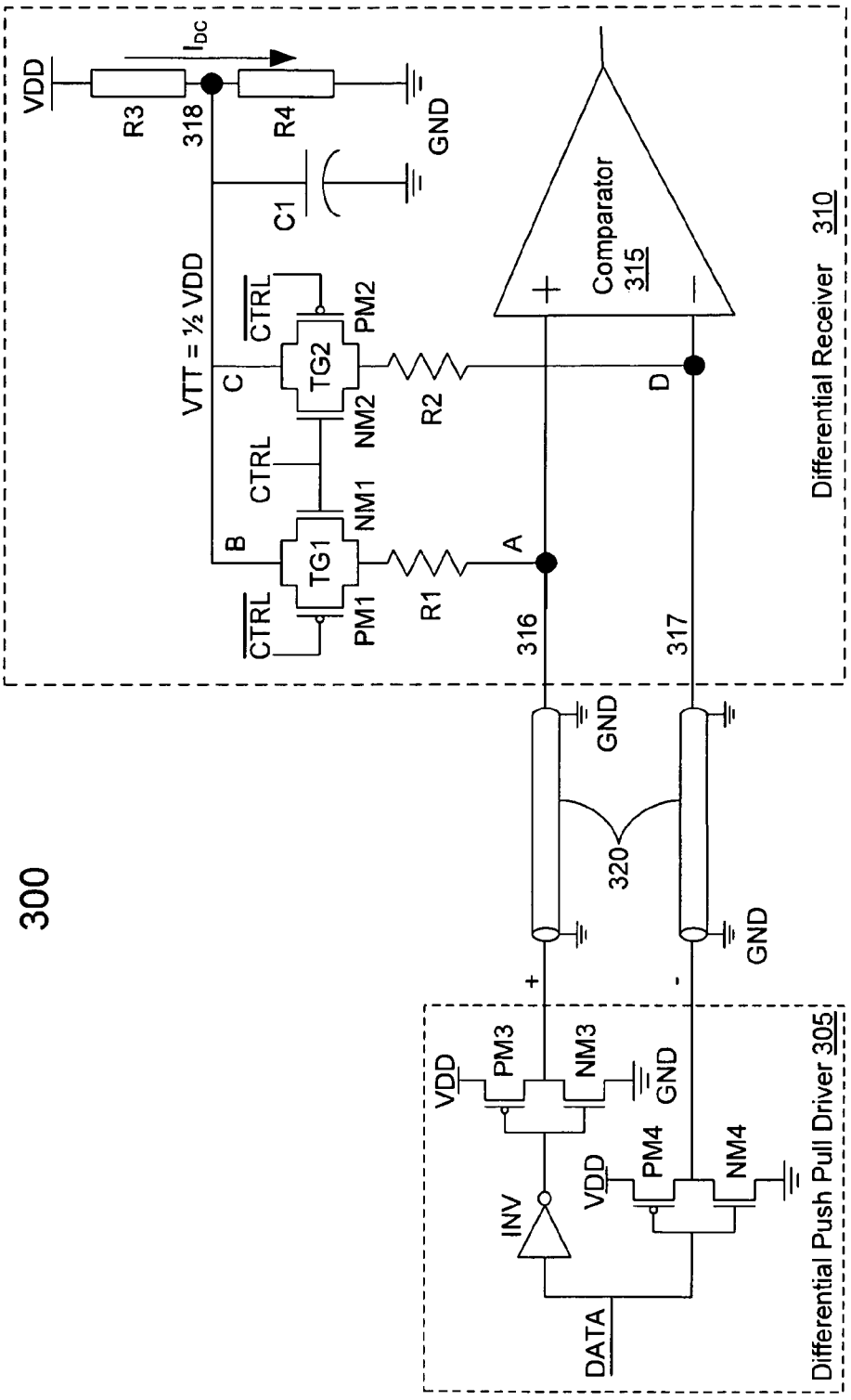
FIG. 3, in accordance with some embodiments of the invention, illustrates an exemplary implementation of the reduced power differential type termination circuit illustrated in FIG. 2.

FIG. 3, in accordance with some embodiments of the invention, illustrates an exemplary implementation of the reduced power differential type termination circuit illustrated in FIG. 2. FIG. 3 illustrates exemplary details of differential driver 205 and first and second switches SW1, SW2. As shown, differential driver 205 may comprise a differential push pull driver and first and second switches SW1, SW2 may comprise transmission gates TG1, TG2. Differential push pull driver 305 comprises a pair of push pull drivers and inverter INV. The first push pull driver is composed of third PMOS transistor PM3 and third NMOS transistor NM3 while the second push pull driver is composed of fourth PMOS transistor PM4 and fourth NMOS transistor NM4. The second inverter receives input data DATA while the first inverter receives inverted input data, i.e., following inversion of input data DATA by inverter INV. As a result of the inversion, first and second push pull drivers output complimentary signals to positive and negative transmission lines 320±. In this embodiment, third and fourth PMOS transistors PM3, PM4 each have the same output impedance as third and fourth NMOS transistors NM3, NM4, but they may not be the same in other embodiments.

First transmission gate TG1 is formed by first PMOS transistor PM1 and first NMOS transistor NM1 while second transmission gate TG2 is formed by second PMOS transistor PM2 and second NMOS transistor NM2. First and second NMOS transistors NM1, NM2 are controlled by control signal CTRL while first and second PMOS transistors PM1, PM2 are controlled by inverted control signal $\overline{CTRL}$. When CTRL is logic high then first and second PMOS transistors PM1, PM2 and first and second NMOS transistors NM1, NM2 are enabled. When CTRL is logic low then they are disabled. The first impedance between terminals A and B is the sum of the on resistance of first transmission gate TG1 and first resistor R1. The second impedance between terminals C and D is the sum of the on resistance of second transmission gate TG2 and second resistor R2. While in this embodiment both transmission gates TG1, TG2 are symmetrical (i.e. match) and first and second resistors R1, R2 match, in other embodiments they may be asymmetrical. The first impedance is equivalent to the output impedance RTT of the termination circuit. Likewise, the second impedance is equivalent to the output impedance RTT of the termination circuit. The sizes of the transistors in first and second transmission gates TG1, TG2 may be made large enough that their on resistance is very small in comparison to first and second resistors R1, R2, which improves the linearity of RTT.

The operation of system 300 will now be discussed. When input data DATA and switch control CTRL are each logic high, third PMOS transistor PM3 and fourth NMOS transistor NM4 are on in differential push pull driver 305 and first and second transmission gates TG1, TG2 are on in differential receiver 310. As a result, current flows from source voltage VDD to ground GND through the path comprising components, in order, PM3, 320+, R1, TG1, TG2, R2, 320− and NM4. In this path, equivalent cumulative impedance from third terminal 318 to source voltage VDD and from third terminal 318 to ground GND assures that reference voltage VTT remains at one-half source voltage VDD. When input data DATA is logic low and switch control CTRL is logic high, fourth PMOS transistor PM4 and third NMOS transistor NM3 are on in differential push pull driver 305 and first and second transmission gates TG1, TG2 are on in differential receiver 310. As a result, current flows from source voltage VDD to ground GND through the path comprising components, in order, PM4, 320−, R2, TG2, TG1, R1, 320+ and NM3. In this path, equivalent cumulative impedance from third terminal 318 to source voltage VDD and from third terminal 318 to ground GND assures that reference voltage VTT remains at one-half source voltage VDD.

Figure 4:
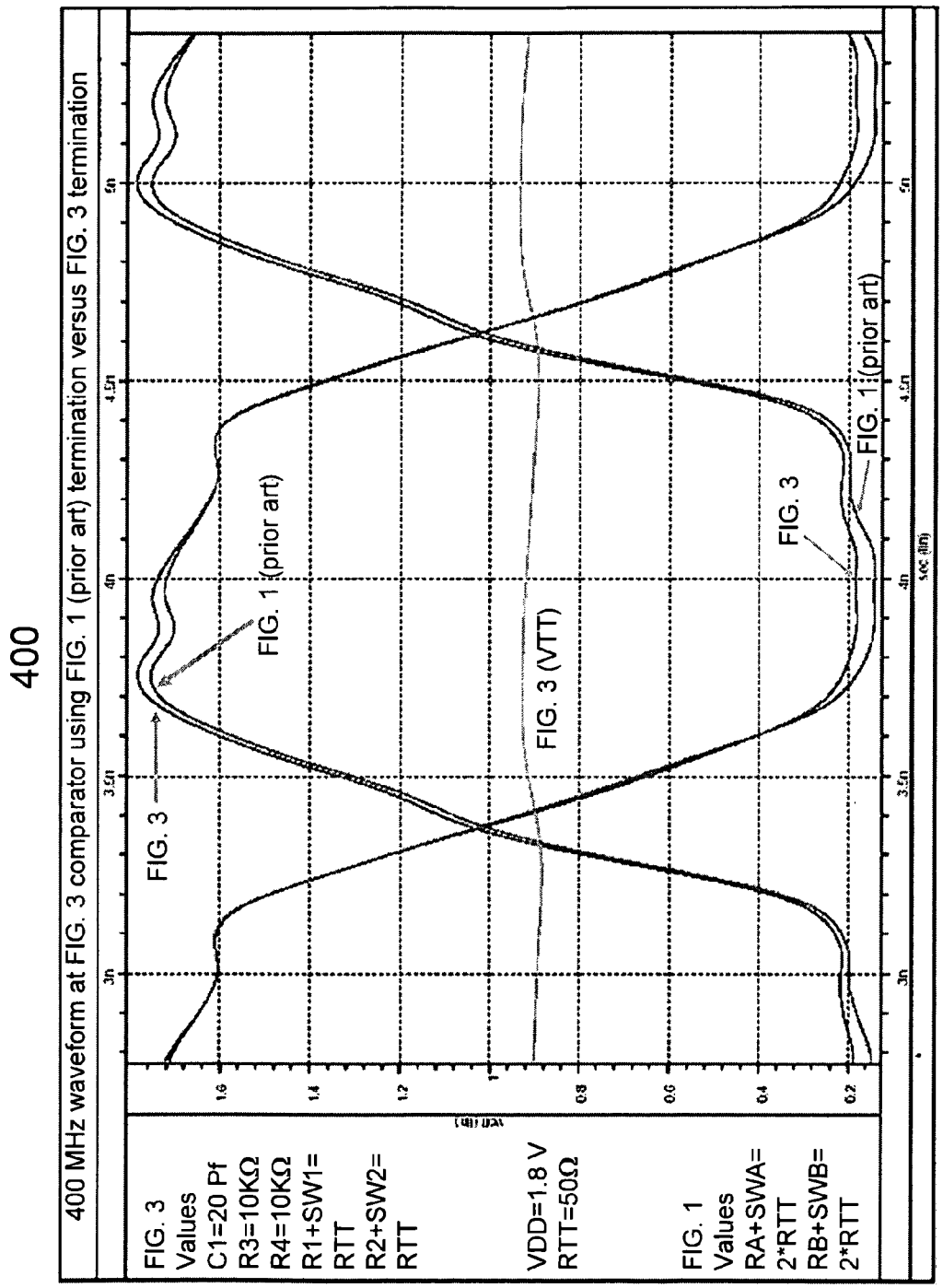
FIG. 4, in accordance with some embodiments of the invention, comparatively illustrates waveforms in a transmission system using the well-known termination circuit shown in FIG. 1 versus using the exemplary implementation of a reduced power differential type termination circuit shown in FIG. 3.

FIG. 4, in accordance with some embodiments of the invention, comparatively illustrates waveforms in a transmission system using the well-known termination circuit shown in FIG. 1 versus using the exemplary implementation of a reduced power differential type termination circuit shown in FIG. 3. FIG. 4 illustrates simulation results of alternating complimentary waveforms received by comparator 315 on transmission lines 320± when using the differential type termination shown in FIG. 3 versus replacing it with the Thevenin type termination shown in FIG. 1. As illustrated in FIG. 4, the waveforms were generated with source voltage VDD at 1.8 Volts, RTT at 50 Ohms, capacitor C1 at 20 pF and third and fourth resistors R3, R4 at 10,000 Ohms each. The alternating complimentary signals generated by differential push pull driver 305 have a frequency of 400 MHz. As shown, reference voltage VTT in FIG. 3 remains fairly constant at approximately 0.9 Volts (i.e. ½ VDD where VDD=1.8 Volts). The waveforms based on FIG. 3 and FIG. 1 termination circuits are nearly the same indicating that signal integrity is maintained. However, the waveforms based on the differential type termination of FIG. 3 were generated with far less direct current and, therefore, far less power consumption in differential receiver 310.

Embodiments of the present invention may be utilized in a wide variety of data transmission applications requiring impedance matched terminations. The reduced power differential type termination circuit, at least in some implementations relative to other termination circuits, may reduce power consumption while maintaining or improving signal integrity and overall performance.

While the present invention has been described with respect to a limited number of embodiments, those skilled in the art will appreciate numerous modifications and variations there from. It is intended that the appended claims cover all such modifications and variations as fall within the true spirit and scope of this present invention.

What is claimed:

1. A differential type termination circuit for coupling between first and second transmission lines that transmit, respectively, first and second signals, the differential type termination circuit comprising:
    a first node for coupling to the first transmission line;
    a second node for coupling to the second transmission line;
    a first impedance having terminals A and B, wherein terminal A is coupled to the first node and terminal B is coupled to a third node;
    a second impedance having terminals C and D, wherein terminal C is coupled to the third node and terminal D is coupled to the second node; and
    a reference voltage generator for generating a reference voltage from a source voltage, wherein the reference voltage is coupled to the third node and the reference voltage generator has low direct current less than 0.001 Amperes.

2. The circuit of claim 1, wherein the first and second signals are complimentary signals.

3. The circuit of claim 2, wherein the first impedance matches the second impedance.

4. The circuit of claim 3, wherein the first impedance matches an impedance of the first transmission line.

5. The circuit of claim 4, wherein the first impedance comprises a first bidirectional switch and a first resistor coupled together in series.

6. The circuit of claim 5, wherein the first bidirectional switch comprises a transmission gate.

7. The circuit of claim 6, wherein the reference voltage is approximately (i.e. within 10% of) one-half a peak magnitude of the first and second signals.

8. The circuit of claim 7, wherein the reference voltage generator comprises a voltage divider coupled between the source voltage and ground.

9. The circuit of claim 8, wherein the circuit is configured for high speed transceiver logic (HSTL) or stub series terminated logic (SSTL).

10. The circuit of claim 9, further comprising:
    a decoupling capacitor coupled to the third node.

11. The circuit of claim 10, wherein the low direct current is less than 0.0001 Amperes.

12. The circuit of claim 11, wherein the circuit is on-die.

13. A transmission line receiver comprising a differential type termination circuit for coupling between first and second transmission lines that transmit complimentary signals, the differential type termination circuit comprising:
    a first node for coupling to the first transmission line;
    a second node for coupling to the second transmission line;
    a first impedance having terminals A and B, wherein terminal A is coupled to the first node and terminal B is coupled to a third node;
    a second impedance having terminals C and D, wherein terminal C is coupled to the third node and terminal D is coupled to the second node; and
    a reference voltage generator for generating a reference voltage, wherein the reference voltage is coupled to the third node and the reference voltage generator has low direct current less than 0.001 Amperes.

14. The circuit of claim 13, wherein the first impedance matches the second impedance.

15. The circuit of claim 14, wherein the first impedance matches an impedance of the first transmission line.

16. The circuit of claim 13, wherein the circuit is configured for high speed transceiver logic (HSTL) or stub series terminated logic (SSTL).

17. A transmission line system comprising:
    a differential transmission line comprising first and second transmission lines for transmitting complimentary signals;

a differential driver coupled to the differential transmission line for transmitting the complimentary signals on the first and second transmission lines; and a differential receiver coupled to the differential transmission line for receiving the complimentary signals on the first and second transmission line, the differential receiver comprising a differential type termination circuit coupled between the first and second transmission lines, the differential type termination circuit comprising:

a first impedance having terminals A and B, wherein terminal A is coupled to the first transmission line and terminal B is coupled to a third node;

a second impedance having terminals C and D, wherein terminal C is coupled to the third node and terminal D is coupled to the second transmission line; and a reference voltage generator for generating a reference voltage, wherein the reference voltage is coupled to the third node and the reference voltage generator has low direct current less than 0.001 Amperes.

18. The transmission line system of claim 17, wherein the differential driver comprises a push pull driver.

19. The transmission line system of claim 17, wherein the transmission line system comprises an HSTL or SSTL system.

20. The transmission line system of claim 17, wherein the first impedance matches an impedance of the first transmission line and the second impedance matches an impedance of the second transmission line.

* * * * *